(12) United States Patent
Boyer et al.

(10) Patent No.: US 12,010,821 B2
(45) Date of Patent: Jun. 11, 2024

(54) THERMAL DIODE DEVICE FOR A TELEMATIC CONTROL UNIT OF A VEHICLE

(71) Applicant: Continental Automotive GmbH, Hannover (DE)

(72) Inventors: Jean-Philippe Boyer, Toulouse (FR); Arnaud Dieudonne, Toulouse (FR)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 458 days.

(21) Appl. No.: 17/434,910

(22) PCT Filed: Mar. 10, 2020

(86) PCT No.: PCT/EP2020/056312
§ 371 (c)(1),
(2) Date: Aug. 30, 2021

(87) PCT Pub. No.: WO2020/182794
PCT Pub. Date: Sep. 17, 2020

(65) Prior Publication Data
US 2022/0061192 A1    Feb. 24, 2022

(30) Foreign Application Priority Data

Mar. 11, 2019 (FR) ...................... 1902429

(51) Int. Cl.
*H05K 7/20* (2006.01)
*G01K 1/14* (2021.01)
(Continued)

(52) U.S. Cl.
CPC .......... *H05K 7/20854* (2013.01); *G01K 1/14* (2013.01); *G01N 25/18* (2013.01); *H01L 23/34* (2013.01)

(58) Field of Classification Search
CPC ...... H01L 23/34; H05K 7/20854; G01K 1/14; G01N 25/18
(Continued)

(56) References Cited

U.S. PATENT DOCUMENTS

| | | | | |
|---|---|---|---|---|
| 4,273,183 A | * | 6/1981 | Altoz | B64D 43/00 165/44 |
| 5,813,765 A | * | 9/1998 | Peel | G01K 1/14 374/208 |

(Continued)

FOREIGN PATENT DOCUMENTS

| | | |
|---|---|---|
| CN | 203520194 U | 4/2014 |
| CN | 204651436 U | 9/2015 |

(Continued)

OTHER PUBLICATIONS

Jianjian et al. "Design and Study of Heat Sinks of Electronic Components", Mechanical and Electrical Information, vol. 24, 2010 with translation, 7 pages.

(Continued)

*Primary Examiner* — Kevin J Comber
(74) *Attorney, Agent, or Firm* — BUCHANAN INGERSOLL & ROONEY PC

(57) ABSTRACT

A thermal diode device including an electronic unit to be cooled, a heat-dissipation medium, a temperature sensor for measuring the temperature of the heat-dissipation medium, and an actuator configured to thermally disconnect the electronic unit from the heat-dissipation medium if the temperature of the heat-dissipation medium is higher than a reference temperature, so as to inhibit any heat transfer between the heat-dissipation medium and the electronic unit, and to thermally connect the electronic unit to the heat-dissipation medium if the temperature of the heat-dissipation medium is lower than the reference temperature, so as to (Continued)

allow a conductive heat transfer between the electronic unit and the heat-dissipation medium.

7 Claims, 1 Drawing Sheet

(51) Int. Cl.
  *G01N 25/18* (2006.01)
  *H01L 23/34* (2006.01)
(58) Field of Classification Search
  USPC .......................................................... 361/139
  See application file for complete search history.

(56) References Cited

U.S. PATENT DOCUMENTS

| | | | |
|---|---|---|---|
| 10,365,049 B2 | 7/2019 | Tso et al. | |
| 2013/0077331 A1* | 3/2013 | Hessling | F21S 45/48 362/470 |
| 2019/0061979 A1* | 2/2019 | Newlin | B64G 1/503 |
| 2019/0123774 A1* | 4/2019 | Zhan | H04B 3/548 |

FOREIGN PATENT DOCUMENTS

| | | |
|---|---|---|
| CN | 107591712 A | 1/2018 |
| CN | 108027227 A | 5/2018 |
| CN | 108571375 A | 9/2018 |
| EP | 2572992 A1 | 3/2013 |
| EP | 3450325 A1 | 3/2019 |
| WO | 2019032813 A1 | 2/2019 |

OTHER PUBLICATIONS

Chinese Office Action for Chinese Application No. 202080020453.4, dated Jul. 28, 2023 with translation, 18 pages.
International Search Report and Written Opinion for International Application No. PCT/EP2020/056312, dated Jun. 17, 2020, with partial English translation, 11 pages.
International Search Report and Written Opinion for International Application No. PCT/EP2020/056312, dated Jun. 17, 2020, 14 pages (French).

* cited by examiner

[Fig. 1]
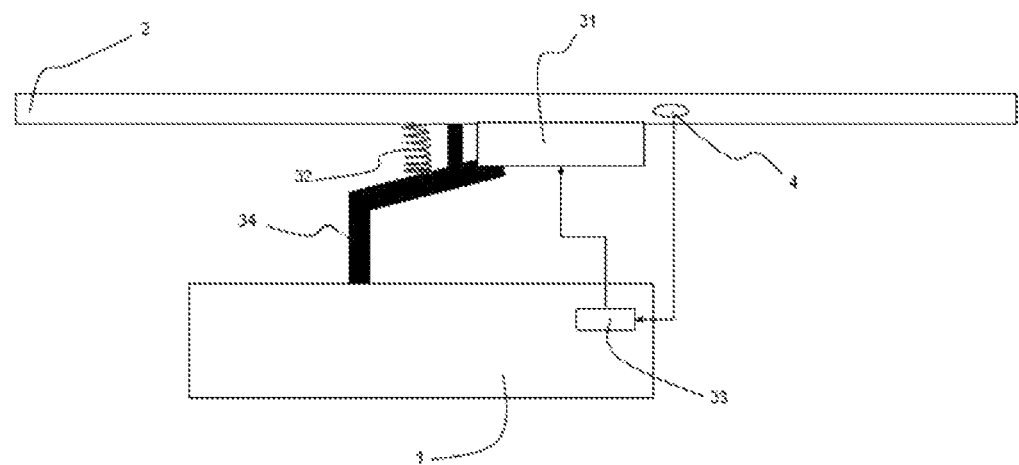
[Fig. 2]
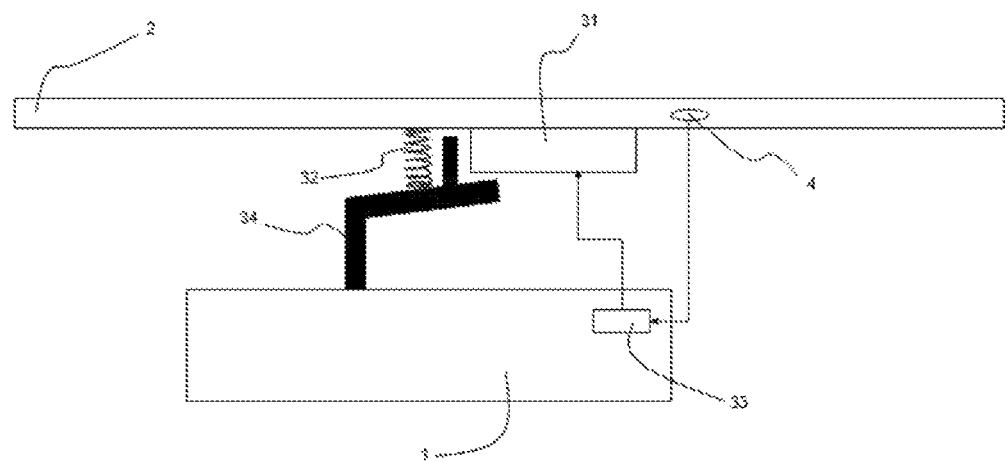

THERMAL DIODE DEVICE FOR A TELEMATIC CONTROL UNIT OF A VEHICLE

CROSS REFERENCE TO RELATED APPLICATIONS

This application is the U.S. National Phase Application of PCT International Application No. PCT/EP2020/056312, filed Mar. 10, 2020, which claims priority to French Patent Application No. 1902429, filed Mar. 11, 2019, the contents of such applications being incorporated by reference herein.

FIELD OF THE INVENTION

The present invention relates to a device for automatically coupling and decoupling an electronic unit with respect to a medium that is able to perform a conductive heat-dissipation function, in other words a heat-sink function. Said device is, in particular, referred to hereinafter as a "thermal diode" because it is configured to allow the transmission of heat in only one direction, i.e. from the electronic unit to the heat-dissipation medium.

More particularly, one application of the invention relates to an electronic module such as a telematic control unit (or TCU), installed close to the roof of a vehicle, said roof corresponding to said medium that is able to provide a heat-dissipation function for dissipating heat given off by the telematic control unit.

BACKGROUND OF THE INVENTION

As is known, recent developments in the automotive field relate to telematic control units and their integration with what are known as "smart" antennas.

These antennas are conventionally arranged at the level of the vehicle roof, in order to optimize their gain in transmitting and receiving signals and thus aid the external connectivity of the vehicle.

In this context, the telematic control unit coupled to at least one antenna is generally also located at roof level, in order to be positioned close to the antenna and thus avoid in particular the inconvenience that would result from the wiring between a telematic control unit, for example arranged in the dashboard, and the antenna located at roof level.

Smart antenna modules are thus generally located just under the roof of the vehicle or at least close to an external body surface of the vehicle.

Such locations are considerably advantageous from the point of view of connectivity, but they also have two main drawbacks: first, due to the location, usually in the ceiling trim of the passenger compartment, space is limited, which imposes substantial constraints in terms of the size of the telematic control unit; second, due to the proximity to the roof, the telematic control unit may be exposed to high temperatures when the vehicle is stationary and exposed to the sun, especially in a region of the world where the sun's rays are strong.

However, it is necessary to dissipate the heat given off by the telematic control unit. Specifically, as is known, electronic components, such as those present in a telematic control unit, have maximum operating temperatures beyond which they may deteriorate, for example resulting in their service life being shortened or in information being lost in the case of non-volatile memories in particular.

When a telematic control unit, as described above, is arranged at the level of the roof of a vehicle, it is difficult to cool it by means of an active convection system, in other words a fan, for space reasons in particular.

The roof may advantageously be used as a very good heat sink when its temperature is low. However, under the particular circumstances mentioned above, the telematic control unit should conversely be isolated as much as possible from the roof and an attempt made to dissipate its heat into the interior of the passenger compartment.

SUMMARY OF THE INVENTION

There is therefore a need for a device that makes it possible to thermally couple and decouple the telematic control unit, or more generally any electronic unit, with respect to the roof of a vehicle, or more generally a medium that is able to perform a heat-dissipation function while being liable to heat up substantially, under certain particular conditions, making it necessary to isolate it from the electronic unit to be cooled.

To that end, an aspect of the present invention relates to a device, referred to as a "thermal diode", that makes it possible to thermally couple and decouple an electronic unit with respect to a heat-dissipation medium, automatically, according to the temperature of said heat-dissipation medium.

More specifically, an aspect of the present invention relates to a thermal diode device comprising an electronic unit to be cooled, a heat-dissipation medium, a temperature sensor for measuring the temperature of the heat-dissipation medium, and an actuator configured to thermally disconnect the electronic unit from the heat-dissipation medium if the temperature of the heat-dissipation medium is higher than a reference temperature, so as to inhibit any conductive heat transfer between the heat-dissipation medium and the electronic unit, and to conductively thermally connect the electronic unit to the heat-dissipation medium if the temperature of the heat-dissipation medium is lower than the reference temperature, so as to allow a conductive heat transfer between the electronic unit and the heat-dissipation medium.

By virtue of an aspect of the invention, it is possible to allow the conductive heat transfer only in one direction, from the electronic unit to be cooled to the heat-dissipation medium, the conductive heat transfer in the other direction, when the heat-dissipation medium is hotter than the electronic unit, being inhibited.

According to one embodiment, the device comprises a sensor of the temperature of the electronic unit, the reference temperature being the temperature of the electronic unit.

Advantageously, the reference temperature is equal to the temperature of the electronic unit multiplied by a weighting coefficient designed to take into account the thermal dissipation specific to the actuator.

According to one embodiment, the electronic unit comprises a thermal pad (34) providing a thermal interface between said electronic unit and the heat-dissipation medium when said electronic unit and said heat-dissipation medium are in physical contact.

According to one embodiment, the actuator comprises a spring connected between the heat-dissipation medium and the thermal pad of the electronic unit in order to exert on the thermal pad of the electronic unit a repulsive force that repulses said electronic unit away from the heat-dissipation medium, and an electromagnet attached to the heat-dissipation medium in order to exert, when it is supplied with power, an attractive force on the thermal pad of the electronic unit in the direction of the heat-dissipation medium.

According to one embodiment, the thermal pad has a mechanical flexibility designed so that, under the effect of the repulsive force, in the absence of the attractive force exerted by the electromagnet, the thermal pad bends so as to separate from the heat-dissipation medium and so that, under the effect of the attractive force which has a higher strength than the repulsive force, the thermal pad unbends so as to come into contact with the heat-dissipation medium.

According to one embodiment, the device comprises a control module configured to:
  activate the electromagnet if the temperature of the heat-dissipation medium is lower than the reference temperature, so that the electromagnet exerts the attractive force, of higher strength than the repulsive force exerted by the spring, on the electronic unit, so as to thermally couple the electronic unit and the heat-dissipation medium by putting them in physical contact, via the thermal pad, and deactivate the electromagnet if the temperature of the heat-dissipation medium is higher than the reference temperature, so that the electromagnet does not exert any attractive force on the electronic unit, the repulsive force exerted by the spring on the thermal pad of the electronic unit allowing the electronic unit and the heat-dissipation medium to be thermally decoupled by virtue of the presence of air between the electronic unit and the heat-dissipation medium.

According to one embodiment, the sensor of the temperature of the roof is a thermocouple.

Advantageously, the electronic unit is a vehicle telematic control unit and the heat-dissipation medium is the roof of a vehicle.

An aspect of the present invention also targets a motor vehicle comprising a passenger compartment having a roof, an antenna arranged on the roof and a telematic control unit coupled to said antenna and arranged under the roof, said vehicle comprising a thermal diode device as briefly described above.

BRIEF DESCRIPTION OF THE DRAWINGS

Other features and advantages of the invention will become more clearly apparent from reading the following description. This description is purely illustrative and should be read with reference to the attached drawings, in which:

FIG. 1 shows an exemplary thermal diode device according to an aspect of the invention, in a position in which the telematic control unit and the roof are conductively thermally coupled.

FIG. 2 shows the same embodiment of a thermal diode device according to an aspect of the invention, in a position in which the telematic control unit and the roof are not conductively thermally coupled.

DETAILED DESCRIPTION OF THE PREFERRED EMBODIMENTS

In what follows, reference is mainly made to an implementation of an aspect of the invention in the context of a motor vehicle for which the device according to an aspect of the invention makes it possible to thermally couple and decouple, automatically, a telematic control unit with respect to the roof.

However, other applications are targeted by an aspect of the present invention, where an electronic unit is positioned close to a medium that is able to provide a heat-dissipation function except under certain conditions in which said medium is hotter than said electronic unit.

With reference to FIG. 1, a telematic control unit 1, also referred to as TCU, as close as possible to an antenna, in particular what is referred to as a "smart" antenna, is shown. In the context of an aspect of the invention, the telematic control unit 1 is an electrical unit giving off heat, which has to be cooled.

The whole is located at the level of the roof 2 of a vehicle: the antenna, from this high point on the vehicle, is in an optimal position for transmitting and receiving signals. The telematic control unit is located in the immediate vicinity of said antenna.

During operation, the telematic control unit 1 gives off heat which has to be dissipated. Specifically, according to the first law of thermodynamics, all of the energy injected into a closed system is output as work or as thermal energy. In this case, the electrical energy injected into the telematic control unit 1 is necessarily at least partly output as heat. This heat must be dissipated so as not to cause overheating, and therefore deterioration, of the electronic components of said telematic control unit 1.

It is known practice to use the roof 2 to dissipate, in particular conductively, the heat given off by the telematic control unit 1 and this is very effective as long as the temperature of said roof is lower than that of the telematic control unit 1. The roof 2 then acts as a heat sink and efficiently dissipates the heat given off by the telematic control unit 1.

However, as was mentioned previously, under certain conditions, in particular in the event of lengthy exposure, in particular when stationary, to the sun, more particularly in geographical regions with where the sun's rays are strong (in the Arabian Peninsula for example), the temperature of the roof 2 may exceed that of the telematic control unit 1, in particular during operation. Typically, the temperature of roof 2 may reach and exceed 80° C. The roof 2 is then hotter than the telematic control unit 1 and it becomes desirable, or even necessary, to inhibit any thermal conduction between the telematic control unit 1 and the roof 2 in order to prevent the roof 2 from transferring heat to the telematic control unit 1, which obviously would run counter to the need to dissipate the heat given off by said telematic control unit 1 and which, furthermore, could even result in, by causing overheating of the electronic components of the telematic control unit 1, deterioration of some of its electronic components, such as for example data loss in a non-volatile memory, even when the system is not in operation.

The device according to an aspect of the invention, shown in FIG. 1, performs a thermal-diode function, in the sense that it provides a coupling between the roof 2 and the telematic control unit 1 that is such that heat can conductively flow only in one direction, i.e. in the direction from the telematic control unit 1 to the roof 2.

In other words, by virtue of the thermal diode device according to an aspect of the invention, the roof 2 is used as a heat sink when the latter is cooler than the telematic control unit 1, and can therefore dissipate the heat given off by said telematic control unit 1. Conversely, by virtue of the thermal diode device according to an aspect of the invention, the telematic control unit 1 is thermally decoupled from the roof 2 when said roof 2 is hotter than the telematic control unit 1, in order to prevent any conductive heat transfer from the roof to said telematic control unit 1.

The thermal diode device according to an aspect of the invention comprises means 4 for measuring the temperature of the roof 2; these measuring means 4 are for example a thermocouple connected to the roof 2. Preferably, the thermal diode device has means for accessing the temperature of the telematic control unit 1, either using its own measuring means, or using communication means that receive information on the temperature of the telematic control unit 1 measured by third-party means.

Depending on the temperature of the roof 2, the thermal diode device according to an aspect of the invention thermally couples or decouples, automatically, the telematic control unit 1 with respect to the roof 2.

More precisely, if the temperature of the roof 2 is higher than a reference temperature, the thermal diode device according to an aspect of the invention is configured to thermally decouple the telematic control unit 1 from the roof 2.

If, conversely, the temperature of the roof 2 is lower than the reference temperature, the thermal diode device according to an aspect of the invention is configured to conductively thermally couple the telematic control unit 1 to the roof 2.

In other words, the thermal diode device according to an aspect of the invention imposes a low thermal resistance between the roof 2 and the telematic control unit 1 when the temperature of the roof 2 is lower than the reference temperature, and imposes a high thermal resistance between the roof 2 and the telematic control unit 1 when the temperature of the roof 2 is higher than the reference temperature.

By default, i.e. in particular if the thermal diode device according to an aspect of the invention is inactive, in other words is not in operation or is not being supplied with power, or if the information on the temperature of the roof 2 is not available, the thermal diode device according to an aspect of the invention may be configured to thermally decouple the telematic control unit 1 from the roof 2.

According to one embodiment, the reference temperature is the temperature of the telematic control unit 1. Preferably, the reference temperature is the temperature of the telematic control unit 1 multiplied by a weighting coefficient designed to take into account the thermal dissipation specific to the thermal diode device when the latter is in operation in order to thermally decouple the telematic control unit 1 from the roof 2. Alternatively, the reference temperature may be a predefined threshold temperature.

An exemplary thermal diode device, and the operation thereof, will now be described in detail with reference to FIGS. 1 and 2.

The thermal diode device according to an aspect of the invention, as shown in FIGS. 1 and 2, is an active device comprising a thermal pad 34, with very low thermal resistance, integrated into the telematic control unit 1.

A spring 32 is configured to move the thermal pad 34 away by exerting a force referred to as a repulsive force thereon. The spring 32 is for example made of a thermally insulating material.

An electromagnet 31, arranged on the roof 2, is configured to counteract the relaxation of the spring 32 by exerting an attractive force on the thermal pad 34 and the telematic control unit 1.

As shown in FIG. 1, when the electromagnet 31 is active, in other words being powered, the thermal pad 34 is attracted toward said electromagnet 31, compressing the spring 32 until a direct physical connection with the roof 2 is established. The thermal pad 34, and therefore the telematic control unit 1, is then in thermal contact with the roof 2 and the overall thermal resistance between said telematic control unit 1 and the roof 2 is low because it corresponds to the thermal resistance of the thermal pad 34 only. Efficient heat transfer is therefore possible between the telematic control unit 1 and the roof 2.

Conversely, as shown in FIG. 2, when the electromagnet 31 is inactive, in other words off, it exerts no attraction on the thermal pad 34 and the telematic control unit 1. The spring 32 is then configured to move the thermal pad 34, and therefore the telematic control unit 1, away from the roof 2.

As a result, the overall thermal resistance between said telematic control unit 1 and the roof 2 is high because it corresponds to the thermal resistance of the air that separates the thermal pad 34, and therefore the telematic control unit 1, from the roof 2, since there is no direct physical contact between said thermal pad 34 and said roof 2.

There is therefore little or no conductive heat transfer between the roof 2 and the telematic control unit 1.

To that end, said thermal pad 34 has a mechanical flexibility designed so that, under the effect of the repulsive force exerted by the spring 32, and in the absence of sufficient attractive force exerted by the electromagnet 31, the thermal pad 34 bends so as to separate from the heat-dissipation medium 2 and so that, conversely, under the effect of the attractive force exerted by the electromagnet 31, which has a higher strength than the repulsive force exerted by the spring 32, the thermal pad 34 unbends so as to come into contact with the heat-dissipation medium 2.

According to an aspect of the invention, the electromagnet 31 is activated or deactivated according to the temperature of the roof 2. In other words, according to one embodiment, the thermal diode device according to an aspect of the invention comprises a control module 33 which receives information on the temperature of the roof 2 from a thermocouple 4.

This information on the temperature of the roof 2 is transmitted to the control module 3, which activates or deactivates the electromagnet 31 according to the difference in temperature between the telematic control unit 1 and the roof 2.

The control module 3 of the thermal diode device according to an aspect of the invention is configured so that:
if the temperature of the roof 2 is higher than a reference temperature, the electromagnet 31 is inactive and the conductive heat transfer between the roof 2 and the telematic control unit 1 is minimized;
if the temperature of the roof 2 is lower than the reference temperature, the electromagnet 31 is active and there is conductive heat transfer between the telematic control unit 1 and the roof 2.

In other words, when the temperature of the roof 2 is higher than the reference temperature, the thermal diode device according to an aspect of the invention thermally decouples the telematic control unit 1 and the roof 2. When the temperature of the roof 2 is lower than the reference temperature, the thermal diode device according to an aspect of the invention thermally couples the telematic control unit 1 and the roof 2.

According to one embodiment, when the thermal diode device is inactive or is not being powered, the electromagnet 31 is deactivated and the thermal pad 34, and therefore the telematic control unit 1, is not thermally connected to the roof 2.

The invention claimed is:

1. A thermal diode device comprising a vehicle telematic control unit to be cooled, a roof, a temperature sensor for measuring the temperature of the roof, and an actuator configured to thermally disconnect the telematic control unit from the roof if the temperature of the roof is higher than a reference temperature, so as to inhibit any conductive heat transfer between the roof and the telematic control unit, and to conductively thermally connect the telematic control unit to the roof if the temperature of the roof is lower than the reference temperature, so as to allow a conductive heat transfer between the telematic control unit and the roof, the telematic control unit comprising an integral thermal pad providing a thermal interface between said telematic control unit and the roof when said telematic control unit and said roof are in physical contact, wherein the actuator comprises a spring connected between the roof and the thermal pad of the telematic control unit in order to exert on the thermal pad of the telematic control unit (1) a repulsive force that repulses said telematic control unit away from the roof, and an electromagnet attached to the roof in order to exert, when it is supplied with power, an attractive force on the thermal pad of the telematic control unit in the direction of the roof.

2. The device as claimed in claim 1, comprising a sensor of the temperature of the telematic control unit, the reference temperature being the temperature of the telematic control unit.

3. The device as claimed in claim 1, the reference temperature being equal to the temperature of the telematic control unit multiplied by a weighting coefficient designed to take into account the thermal dissipation specific to the actuator.

4. The device as claimed in claim 1, wherein the thermal pad has a mechanical flexibility designed so that, under the effect of the repulsive force, in the absence of the attractive force exerted by the electromagnet (31), the thermal pad bends so as to separate from the roof and so that, under the effect of the attractive force which has a higher strength than the repulsive force, the thermal pad unbends so as to come into contact with the roof.

5. The device as claimed in claim 4, comprising a control module configured to:
 activate the electromagnet if the temperature of the roof is lower than the reference temperature, so that the electromagnet exerts the attractive force, of higher strength than the repulsive force exerted by the spring, on the telematic control unit, so as to conductively thermally couple the telematic control unit and the roof by putting them in physical contact, via the thermal pad, and deactivate the electromagnet if the temperature of the roof is higher than the reference temperature, so that the electromagnet does not exert any attractive force on the telematic control unit, the repulsive force exerted by the spring on the thermal pad of the telematic control unit allowing the telematic control unit and the roof to be conductively thermally decoupled by virtue of the presence of air between the telematic control unit and the roof.

6. The device as claimed in claim 1, wherein the sensor of the temperature of the roof is a thermocouple.

7. A motor vehicle comprising a passenger compartment having a roof, an antenna arranged on the roof and a telematic control unit coupled to said antenna and arranged under the roof, said vehicle comprising a thermal diode device as claimed in claim 1.

* * * * *